(12) United States Patent
Mou et al.

(10) Patent No.: US 12,044,235 B2
(45) Date of Patent: Jul. 23, 2024

(54) FILTRATION AND PURIFICATION DEVICE

(71) Applicant: MICROJET TECHNOLOGY CO., LTD., Hsinchu (TW)

(72) Inventors: Hao-Jan Mou, Hsinchu (TW);
Ching-Sung Lin, Hsinchu (TW);
Chin-Chuan Wu, Hsinchu (TW);
Chi-Feng Huang, Hsinchu (TW);
Yung-Lung Han, Hsinchu (TW);
Chun-Yi Kuo, Hsinchu (TW);
Chin-Wen Hsieh, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 463 days.

(21) Appl. No.: 17/386,475

(22) Filed: Jul. 27, 2021

(65) Prior Publication Data

US 2022/0065244 A1    Mar. 3, 2022

(30) Foreign Application Priority Data

Aug. 31, 2020 (TW) ................. 109129790

(51) Int. Cl.
*F04B 53/20* (2006.01)
*F04B 43/04* (2006.01)

(52) U.S. Cl.
CPC ............ *F04B 53/20* (2013.01); *F04B 43/043* (2013.01); *B81B 2201/036* (2013.01)

(58) Field of Classification Search
CPC ...... F04B 53/20; F04B 43/043; F04B 43/046; F04B 45/047; F04B 53/10; B81B 2201/036; F24F 8/10; F24F 11/39; F24F 13/20; F24F 2110/50; Y02A 50/20; G01N 33/0031; G01N 33/0063; G01N 33/0075

USPC .......................................................... 95/286
See application file for complete search history.

(56) References Cited

U.S. PATENT DOCUMENTS 6,368,393 B1 *  4/2002  Hironaka ............... B01D 46/62
                                                                          96/417

FOREIGN PATENT DOCUMENTS

| CN | 106288257 | A  | 1/2017  |
| CN | 108302686 | A  | 7/2018  |
| CN | 109084375 | A  | 12/2018 |
| CN | 208186517 | U  | 12/2018 |
| CN | 208292766 | U  | 12/2018 |
| CN | 209326002 | U  | 8/2019  |
| CN | 209696488 | U  | 11/2019 |
| CN | 110905789 | A  | 3/2020  |
| EP | 3456969   | A1 | 3/2019  |
| TW | 445361    | B  | 7/2001  |
| TW | I607190   | B  | 12/2017 |

(Continued)

*Primary Examiner* — Robert A Hopkins
*Assistant Examiner* — Qianping He
(74) *Attorney, Agent, or Firm* — Birch, Stewart, Kolasch & Birch, LLP

(57) ABSTRACT

A filtration and purification device includes a main body and one or more filtration passage layer. A plurality of purification chambers is disposed in the filtration passage layer. Each of the purification chambers has a flow-guiding unit, a filtration unit, a gas sensor, and an outlet valve. The flow-guiding unit introduces the gas into the purification chamber, the filtration unit filters the gas, and the gas sensor determines that if the filtered gas reaches a threshold for breathing so as to determine to open the outlet valve to discharge the gas out of the filtration and purification device.

15 Claims, 14 Drawing Sheets

(56) References Cited

FOREIGN PATENT DOCUMENTS

| TW | M553219 U | * 12/2017 |
| TW | I626980 B | 6/2018 |

* cited by examiner

FILTRATION AND PURIFICATION DEVICE

CROSS-REFERENCE TO RELATED APPLICATION

This non-provisional application claims priority under 35 U.S.C. § 119(a) to Patent Application No. 109129790 filed in Taiwan, R.O.C. on Aug. 31, 2020, the entire contents of which are hereby incorporated by reference.

BACKGROUND

Technical Field

The present disclosure relates to a filtration and purification device, in particular, to a filtration and purification device with enhanced gas introduction and is incorporated with a gas detection function.

Related Art

Nowadays people pay more and more attention to monitoring ambient air quality in daily life, such as carbon monoxide, carbon dioxide, volatile organic compounds (VOC), PM2.5, nitric oxide, and sulfur monoxide etc., and the particle suspended in the air, which can cause adverse health effects on the human body when exposure to these gases and can even be life-threatening. Therefore, various countries have focused on the topic of how to monitor ambient air quality to avoid or escape from the health affecting effects and/or injuries in time.

Moreover, in order to avoid breathing harmful gases or particles into the human body, one kind of nasal-plug filter that can be inserted into a nostril to provide filtration and purification function for inhaled gases is provided now. However, the filter inside the nasal-plug filter might make the user suffer from the problem of insufficient inhaled volume and make the user breathing difficulty, resulting in the discomfort condition of the user during using such nasal-plug filter.

In view of above disadvantages, how to provide a filtration and purification device that could solve above problems is an issue to be addressed.

SUMMARY

One object of the present disclosure is to provide a filtration and purification device in which the flow-guiding unit is provided to enhance the gas introduction, so that the gas with higher pressure or higher flow volume can be directed to the filter, thereby improving the gas introduction effect. The gas can pass through the filter more quickly, so that a filtered and purified gas can be provided to the user. Moreover, the gas sensor in the nasal-plug filter device can also detect the gas, so that the user not only can breathe the filtered and purified gas but also can understand the quality of the gas to be inhaled.

A general embodiment of the present disclosure provides a filtration and purification device includes a main body having an inlet end and an outlet end and at least one filtration passage layer disposed in the main body. The at least one filtration passage layer includes a plurality of purification chambers, a convergence chamber, and a circulation channel, wherein the purification chambers are arranged in parallel and bottoms of the purification chambers are in communication with the convergence chamber, and the circulation channel is in communication with the convergence chamber, wherein each of the purification chambers comprise at least one flow-guiding unit, at least one filtration unit, at least one gas sensor, and an outlet valve, wherein the circulation channel has an inlet valve disposed between the convergence chamber and the circulation channel, and each of the outlet valves is disposed between the corresponding purification chamber and the convergence chamber, and wherein each of the outlet valves controls the on/off control of the communication between the corresponding purification chamber and the convergence chamber, and the inlet valve control the on/off control of the communication between the convergence chamber and the circulation channel; wherein when the at least one flow-guiding unit is driven, a gas is introduced into each of the purification chambers from the inlet end of the main body, and the at least one filtration unit filters the gas to obtain a purified gas, and introduces the purified gas into the convergence chamber, wherein the at least one gas sensor detects the gas quality of the purified gas and determines if the gas quality of the purified gas reaches a threshold for breathing, wherein when the purified gas does not reach the threshold for breathing, the inlet valve of the circulation channel of is opened, so that the purified gas can be introduced back to the at least one filtration passage layer again, and wherein when the purified gas reaches the threshold for breathing, the purified gas is discharged out of the filtration and purification device from the outlet end.

BRIEF DESCRIPTION OF THE DRAWINGS

The disclosure will become more fully understood from the detailed description given herein below for illustration only, and thus not limitative of the disclosure, wherein.

DETAILED DESCRIPTION

The present disclosure will now be described more specifically with reference to the following embodiments. It is to be noted that the following descriptions of different embodiments of this disclosure are presented herein for purpose of illustration and description only, and it is not intended to limit the scope of the present disclosure.

Figure 1:
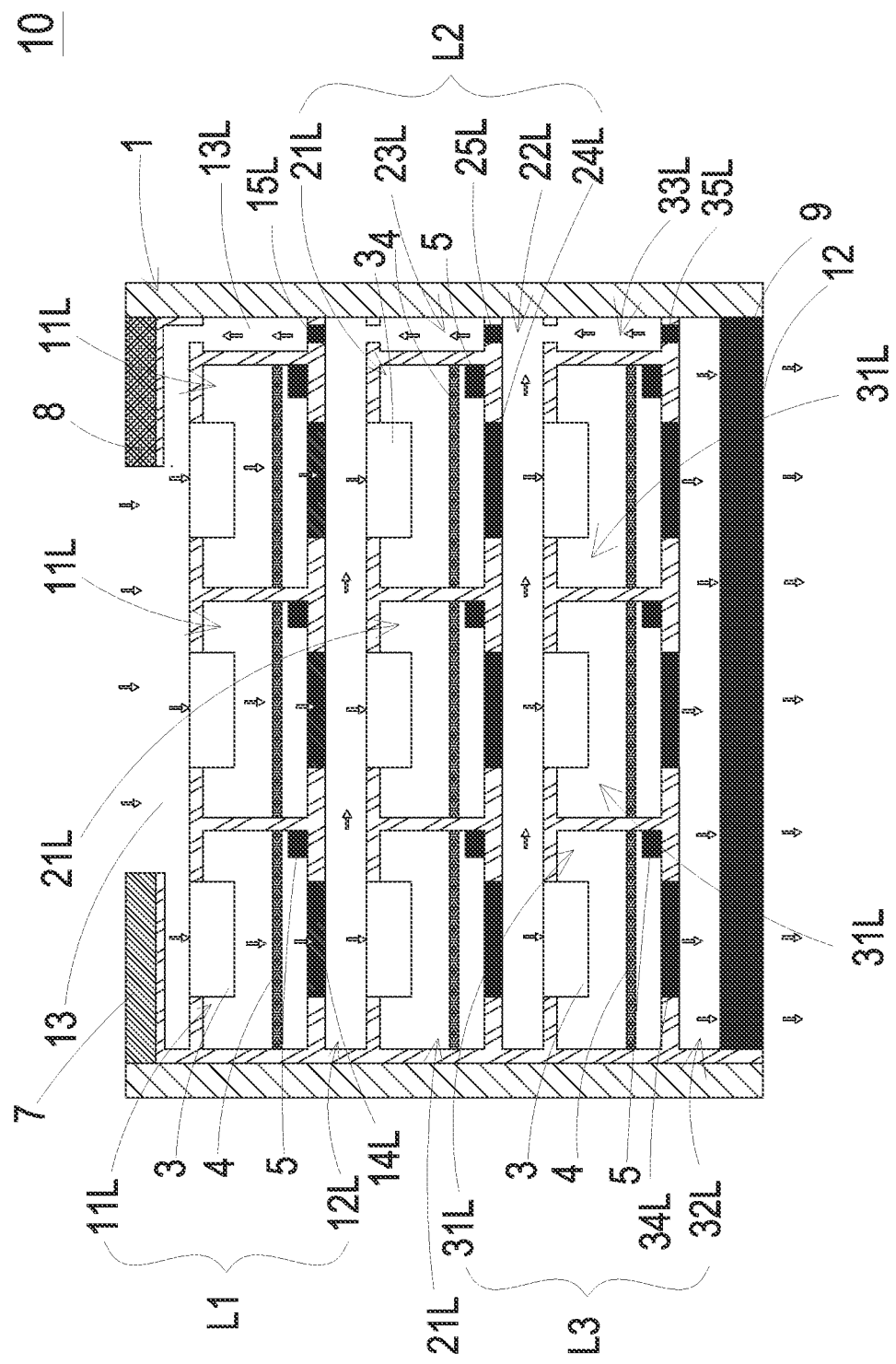
FIG. 1 illustrates a schematic view of a filtration and purification device according to an exemplary embodiment of the present disclosure.

As shown in FIG. 1, a filtration and purification device 10 includes a main body 1 and at least one filtration passage layer is provided. The main body 1 has an inlet end 13 and an outlet end 12. In this embodiment, the number of the filtration passage layers is exemplified by three, which are respectively the first filtration passage layer L1, the second filtration passage layer L2, and the last filtration passage layer L3, but not limited thereto; the number of the filtration passage layers may be adjusted according to actual requirements. The structures of the first filtration passage layer L1, the second filtration passage layer L2, and the last filtration passage layer L3 are similar, and the structure of the filtration passage layer is exemplified by the first filtration passage layer L1 as below. The first filtration passage layer L1 is disposed in the main body 1, and includes a plurality of purification chambers 11L, a convergence chamber 12L, and a circulation channel 13L. The purification chambers 11L are arranged in parallel, and the bottoms thereof are in communication with the convergence chamber 12L. The circulation channel 13L disposed at one side of the first filtration passage layer L1 is in communication with the convergence chamber 12L. Each of the purification chambers 11L includes at least one flow-guiding unit 3, at least one filtration unit 4, at least one gas sensor 5, and an outlet valve 14L. The circulation channel 13L has an inlet valve 15L. The communication between the convergence chamber 12L and the circulation channel 13L is controlled by opening or closing the inlet valve 15L. The communication between the purification chamber 11L and the convergence chamber 12L is controlled by opening or closing the outlet valve 14L.

The filtration unit 4 may be a high-efficiency particulate air (HEPA) filter coated with a cleansing factor layer containing chlorine dioxide for suppressing viruses and bacteria in the gas. In another embodiment, the filtration unit 4 may bean HEPA filter coated with a herbal protection coating layer including the extracts of *Rhus chinensis* Mill (may be *Rhus chinensis* Mill from Japan) and the extracts of Ginkgo biloba to form a herbal protection anti-allergy filter which can efficiently perform anti-allergy function and destroy cell surface proteins of influenza viruses passing through the herbal protection anti-allergy filter.

When the flow-guiding unit 3 in the purification chamber 11L is driven, the gas outside the main body 1 is introduced into the purification chamber 11L of the first filtration passage layer L1 in the main body 1 from the inlet end 13. The gas in the purification chamber 11L is filtered and purified by the filtration unit 4 in the purification chamber 11, and the purified gas is introduced into the convergence chamber 12L through the operation of the flow-guiding unit 3, and detects the gas quality of the purified gas by the gas sensor 5 in the purification chamber 11L to determine if the gas quality of the purified gas reaches a threshold for breathing. The inlet valve 15L of the circulation channel 13L is controlled to be opened or closed based on the threshold for breathing as a determination criterion. When the gas quality of the purified gas does not reach the threshold for breathing, the inlet valve 15L of the circulation channel 13L is opened, so that the purified gas is introduced back to the first filtration passage layer again for circulating, filtering, and purifying, and is detected again. When the purified gas reaches the threshold for breathing, the purified gas can be discharged out from the outlet end 12. In this embodiment, the threshold for breathing may be, but not limited thereto, the concentration of a hazardous gas or the concentration of a suspension particulate.

Please still refer to FIG. 1. The filtration passage may include the first filtration passage layer L1 and the second filtration passage layer L2. The first filtration passage layer L1 and the second filtration passage layer L2 are formed and stacked with each other by semiconductor manufacturing processes. The flow-guiding unit 3 of the purification chamber 21L of the second filtration passage layer 2 is disposed adjacent to one side of the inlet end 13. The filtration unit 4 and the gas sensor 5 are sequentially disposed below the flow-guiding unit 3, and the outlet valve 14L is disposed below the gas sensor 5 and adjacent to the outlet end 12. The flow-guiding unit 3 drives the gas into the purification chamber 21L to be filtered and purified by the filtration unit 3, and the purified gas passes through the gas sensor 4, so that the gas quality of the purified gas can be detected by the gas sensor 5 to determine if the gas quality of the purified gas reaches the threshold for breathing. The purified gas is discharged out of the purification chamber 21L and introduced into the convergence chamber 22L of the second filtration passage layer L2 from the outlet valve 24L. When the gas sensor 5 of the purification chamber 21L of the second filtration passage layer L2 detects and determines that the gas quality of the purified gas does not reach the threshold for breathing, the inlet valve 25L of the circulation channel 23L is opened, so that the purified gas is introduced back to the second filtration passage layer L2 for circulating, filtering, and purifying, and is detected again. When the purified gas reaches the threshold for breathing, the purified gas can be discharged out from the outlet end 12.

When the gas quality of the purified gas detected by the gas sensor 5 of the purification chamber 11L of the first filtration passage layer L1 does not reach the threshold for breathing, the outlet valve 14L of the purification chamber 11L, where the gas sensor 5 of the first filtration passage layer L1 is located, of the first filtration passage layer L1 is controlled to be closed and is not in communication with the convergence chamber 12L. Therefore, the purified gas which does not reach the threshold for breathing is not introduced into the convergence chamber 12L. Moreover, the outlet valves 24L of all the purification chambers 21L of the second filtration passage layer L2 are closed, and the inlet valve 15L of the circulation channel 13L of the first filtration passage layer L1 is opened, so that the purified gas of the first filtration passage layer L1 can be introduced backed to the first filtration passage layer L1 again for circulating, filtering, and purifying, and is detected again. The purified gas in the convergence chamber 12L of the first filtration passage layer L1 enters into the filtration units 4 of the purification chambers 21L in the second filtration passage layer L2 to be filtered and purified for second-time, and the gas sensors 5 in all of the purification chambers 21L of the second filtration passage layer L2 detect if the purified gas which has been filtered and purified for second-time reaches the threshold for breathing to determine if the purified gas can be discharged out of the filtration and purification device 10 from the outlet end 12, so as to provide the purified gas which has been filtered and purified.

Please still refer to FIG. 1. The filtration passage may further include the last filtration passage layer L3. The last filtration passage layer is stacked on the second filtration passage layer and is in communication with the bottom of the second filtration passage layer. When the gas sensor 5 of the purification chamber 21L of the second filtration passage layer L2 detects that the gas quality of the purified gas does not reach the threshold for breathing, the outlet valve 24L of the purification chamber 21L, where the gas sensor 5 is located, of the second filtration passage layer L1 is controlled to be closed and is not in communication with the convergence chamber 22L. Therefore, the purified gas which does not reach the threshold for breathing is not introduced into the convergence chamber 22L. When the gas sensor 5 of the purification chamber 31L of the last filtration passage layer L3 detects that the gas quality of the purified gas does not reach the threshold for breathing, the outlet valves 34L of all the purification chambers 31L of the last filtration passage layer L3 are closed, and the inlet valve 25L of the circulation channel 23L of the second filtration passage layer L2 is opened, so that the purified gas of the second filtration passage layer L2 can be introduced backed to the second filtration passage layer L2 for circulating, filtering, and purifying, and is detected again. The purified gas in the convergence chamber 22L of the second filtration passage layer L2 enters into the filtration units 4 of the purification chambers 31L in the last filtration passage layer L3 to be filtered and purified for second-time, and the gas sensors 5 in all of the purification chambers 31L of the last filtration passage layer L3 detect that if the purified gas which has been filtered and purified for second-time reaches the threshold for breathing to determine if the purified gas can be discharged out of the filtration and purification device 10 from the outlet end 12, so as to provide the filtered and purified gas by the filtration and purification device 10.

Figure 7:
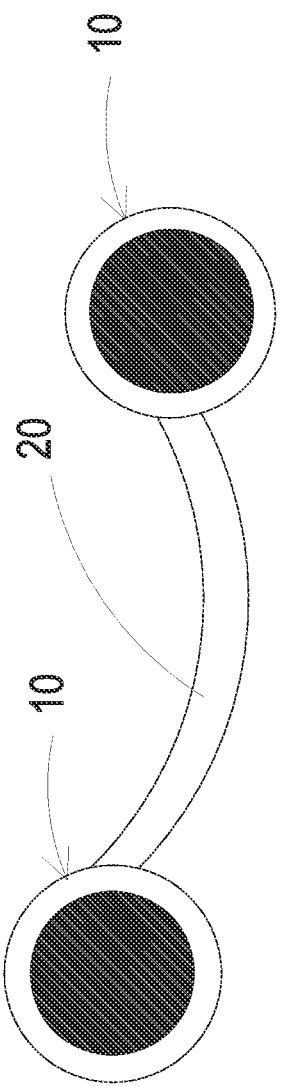
FIG. 7 illustrates a schematic view showing that the filtration and purification device according to an exemplary embodiment of the present disclosure as a nasal-plug.

Please refer to FIG. 1 and FIG. 7. The main body 1 of the filtration and purification device 10 is made of a soft, flexible, and antiallergic material, and the main body 1 can be inserted into a nostril of a user. Furthermore, two filtration and purification devices 10 may be connected through a connection member 20, so that the two filtration and purification devices 10 can be respectively inserted into two nostrils of the user.

Please refer to FIG. 1. The filtration and purification device 10 has a driving chip 7 and a battery 8 respectively packaged on the first filtration passage layer L1 by semiconductor manufacturing processes. The battery 8 provides operation power for the driving chip 7, and the driving chip 7 is capable of driving the flow-guiding units 3, the gas sensors 5, the outlet valves 14L, 24L, 34L, and the inlet valves 15L, 25L, 35L. The driving chip 7 further includes a microprocessor (not shown) and a communication device (not shown). The microprocessor is capable of controlling the flow-guiding units 3, the gas sensors 5, the inlet valves 15L, 25L, 35L, and the outlet valves 14L, 24L, 34L, and receiving a gas quality data of the purified gas detected by the gas sensor 5 for calculating, processing, and transmitting the gas quality data to an external device through the communication device. The external device received the gas quality data is capable of issuing a warning notice and displaying a record of the gas quality. Moreover, a waterproof gas-permeable membrane 9 is attached to the outlet end 12 of the main body 1 for preventing water moist from passing through the main body 1.

The gas sensor 5 may be a volatile organic compound sensor capable of detecting formaldehyde, ammonia, carbon monoxide, carbon dioxide, oxygen, or ozone gas. Alternatively, in some embodiments, the gas sensor 5 may be a virus sensor capable of detecting viruses. Alternatively, in some embodiments, the gas sensor 5 may be a particulate sensor capable of detecting particulate matters of PM1, PM2, or PM10.

Figure 2A:
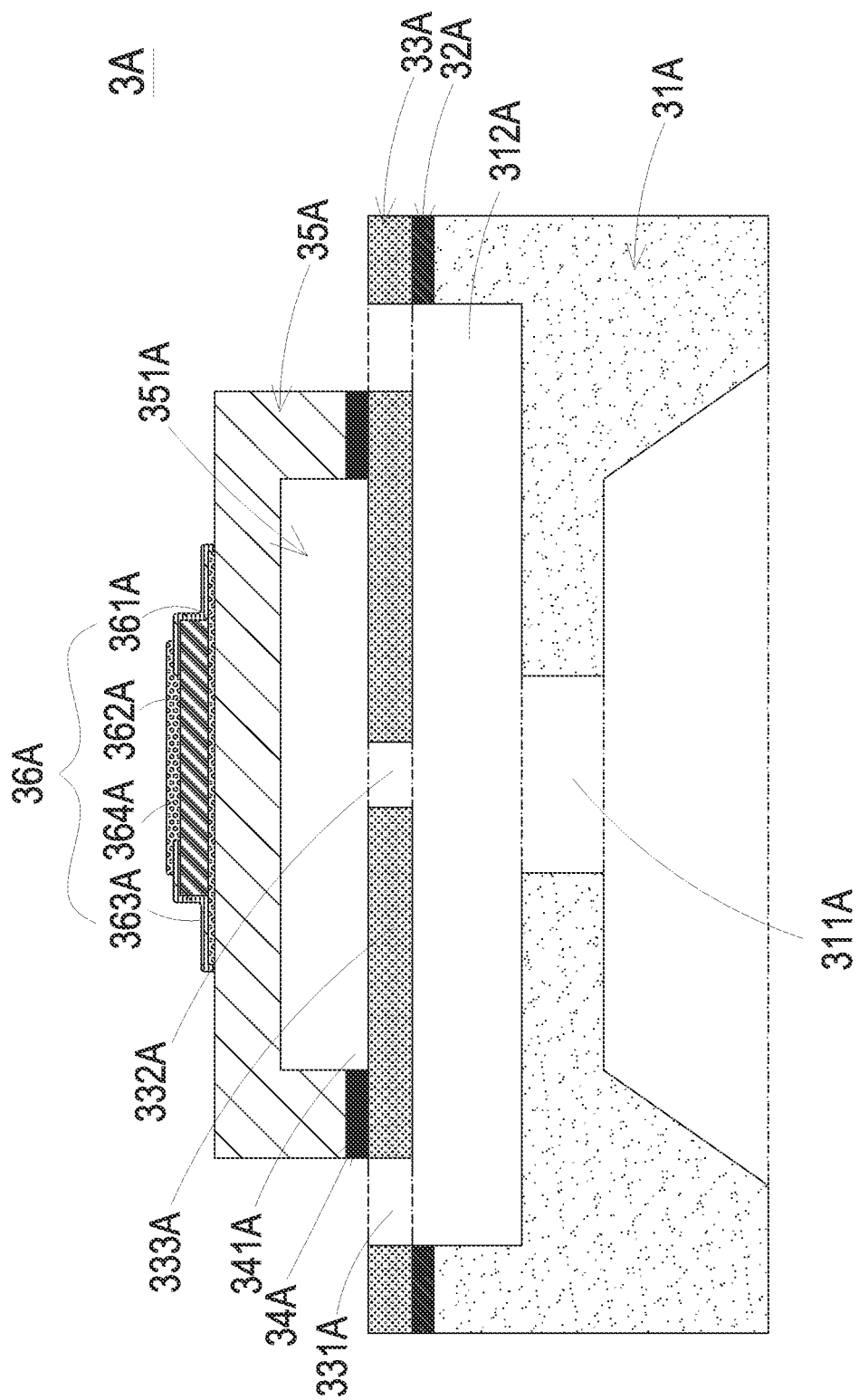
FIG. 2A illustrates a schematic cross-sectional view of an MEMS blower-type pump of the filtration and purification device of the exemplary embodiment.
Figure 2B:
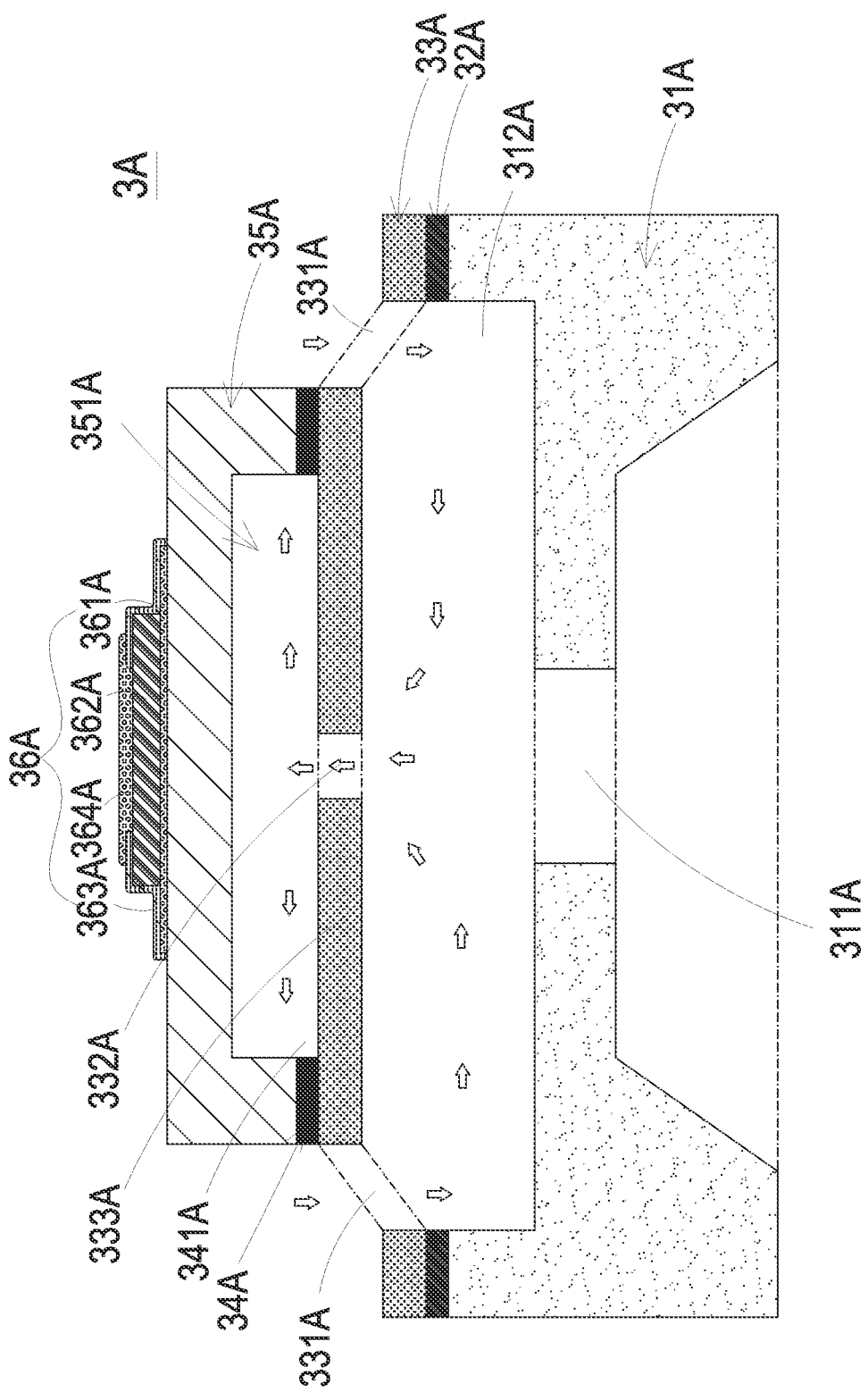
FIG. 2B and FIG. 2C illustrate schematic cross-sectional views showing the operation steps of the MEMS blower-type pump shown in FIG. 2A.
Figure 2C:
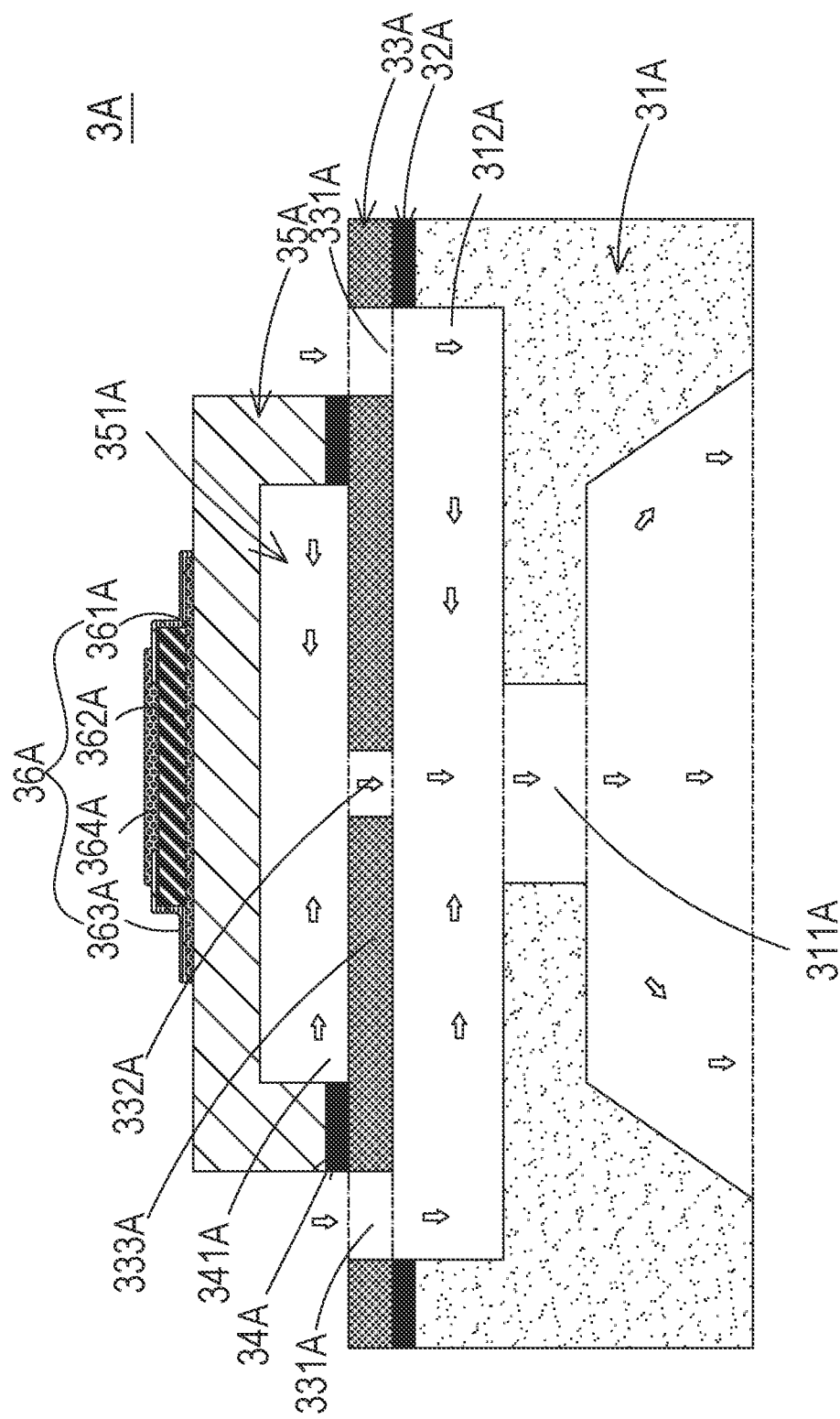

As shown in FIG. 2A to FIG. 2C, in some embodiments, the flow-guiding unit 3 may be a microelectromechanical systems (MEMS) blower-type pump 3A including an outlet base 31A, a first oxide layer 32A, a nozzle resonance layer 33A, a second oxide layer 34A, a resonance chamber layer 35A, and a first piezoelectric component 36A, which are all fabricated by semiconductor manufacturing processes. The semiconductor manufacturing processes include an etching process and a deposition process. The etching process may be a wet etching process, a dry etching process, or a combination thereof, but not limited thereto. The deposition process may be a physical vapor deposition (PVD) process, a chemical vapor deposition (CVD) process, or a combination thereof, but not limited thereto. The detailed descriptions about the process are omitted.

In some embodiments, the aforementioned outlet base 31A is formed with an outlet chamber 311A and a compression chamber 312A through a silicon substrate etching process. A penetration hole 313A is formed by etching between the outlet chamber 311A and the compression chamber 312A. The first oxide layer 32A is formed and stacked on the outlet base 31A by deposition. The portion of the first oxide layer 32A corresponding to the compression chamber 312A is removed by etching. The nozzle resonance layer 33A is formed and stacked on the first oxide layer 32A by deposition. A plurality of inlet holes 331A is formed at the portion of the nozzle resonance layer 33A corresponding to the compression chamber 312A by etching. A portion of the nozzle resonance layer 33A corresponding to the central portion of the compression chamber 312A is etched to form a nozzle hole 332A, so that a suspension area 333A capable of being vibrated is formed between the inlet holes 331A and the nozzle hole 332A. The second oxide layer 34A is formed and stacked on the suspension area 333A of the nozzle resonance layer 33A by deposition, and a portion of the second oxide layer 34A is etched to form a resonance chamber area 341A in communication with the nozzle hole 332A. A resonance chamber 351A is formed on the resonance chamber layer 35A by a silicon substrate etching process, and the resonance chamber layer 35A is correspondingly stacked on and bonded to the second oxide layer 34A, so that the resonance chamber 351A is corresponding to the resonance chamber area 341A of the second oxide layer 34A. The first piezoelectric component 36A formed and stacked on the resonance chamber layer 35A by deposition includes a first lower electrode layer 361A, a first piezoelectric layer 362A, a first insulation layer 363A, and a first upper electrode layer 364A. The first lower electrode layer 361A is formed and stacked on the resonance chamber layer 35A by deposition, and the first piezoelectric layer 362A is formed and stacked on a portion of a surface of the first lower electrode layer 361A by deposition. The first insulation layer 363A is formed and stacked on a portion of a surface of the first piezoelectric layer 362A by deposition. The first upper electrode layer 364A is formed and stacked on the surface of the first insulation layer 363A and the remaining portion of the surface of the first piezoelectric layer 362A which is not covered by the first insulation layer 363A for being electrically connected to the first piezoelectric layer 362A.

The structure of the MEMS blower-type pump 3A can be appreciated from above description. Next, the operation of gas introduction implemented by the MEMS blower-type pump 3A is elaborated below accompanied with FIG. 2B and FIG. 2C. The first piezoelectric component 36A drives the nozzle resonance layer 33A to resonate with the first piezoelectric component 36A, and thus the suspension area 333A of the nozzle resonance layer 33A will vibrate in a reciprocating manner. The gas outside the MEMS blower-type pump 3A can be drawn into the compression chamber 312A through the inlet holes 331A, and further directed to the resonance chamber 351A through the nozzle hole 332A.

Through controlling the vibration frequency of the gas in the resonance chamber 351A and making the vibration frequency of the gas in the resonance chamber 351A nearly the same with the vibration frequency of the suspension area 333A, the resonance chamber 351A and the suspension area 333A can generate the Helmholtz resonance effect. Then, the gas is discharged out from the resonance chamber 351A and converged at the compression chamber 312A. The gas further passes through the penetration hole 313A and is discharged out from the outlet chamber 311A with a relatively higher pressure, thereby achieving high pressure transmission of gas and thus improving the transmission efficiency of the gas.

Figure 3A:
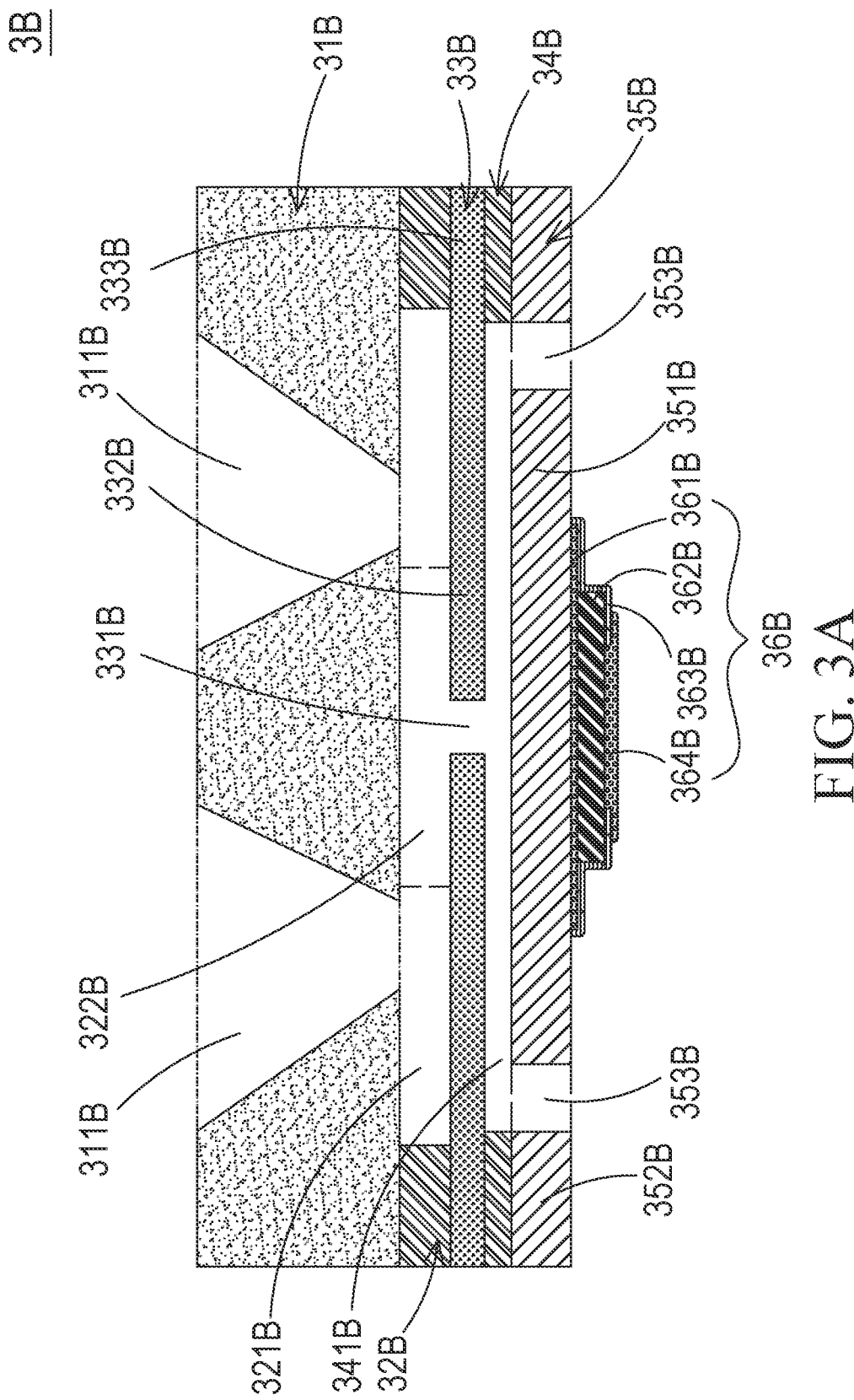
FIG. 3A illustrates a schematic cross-sectional view of an MEMS pump of the filtration and purification device of the exemplary embodiment.
Figure 3B:
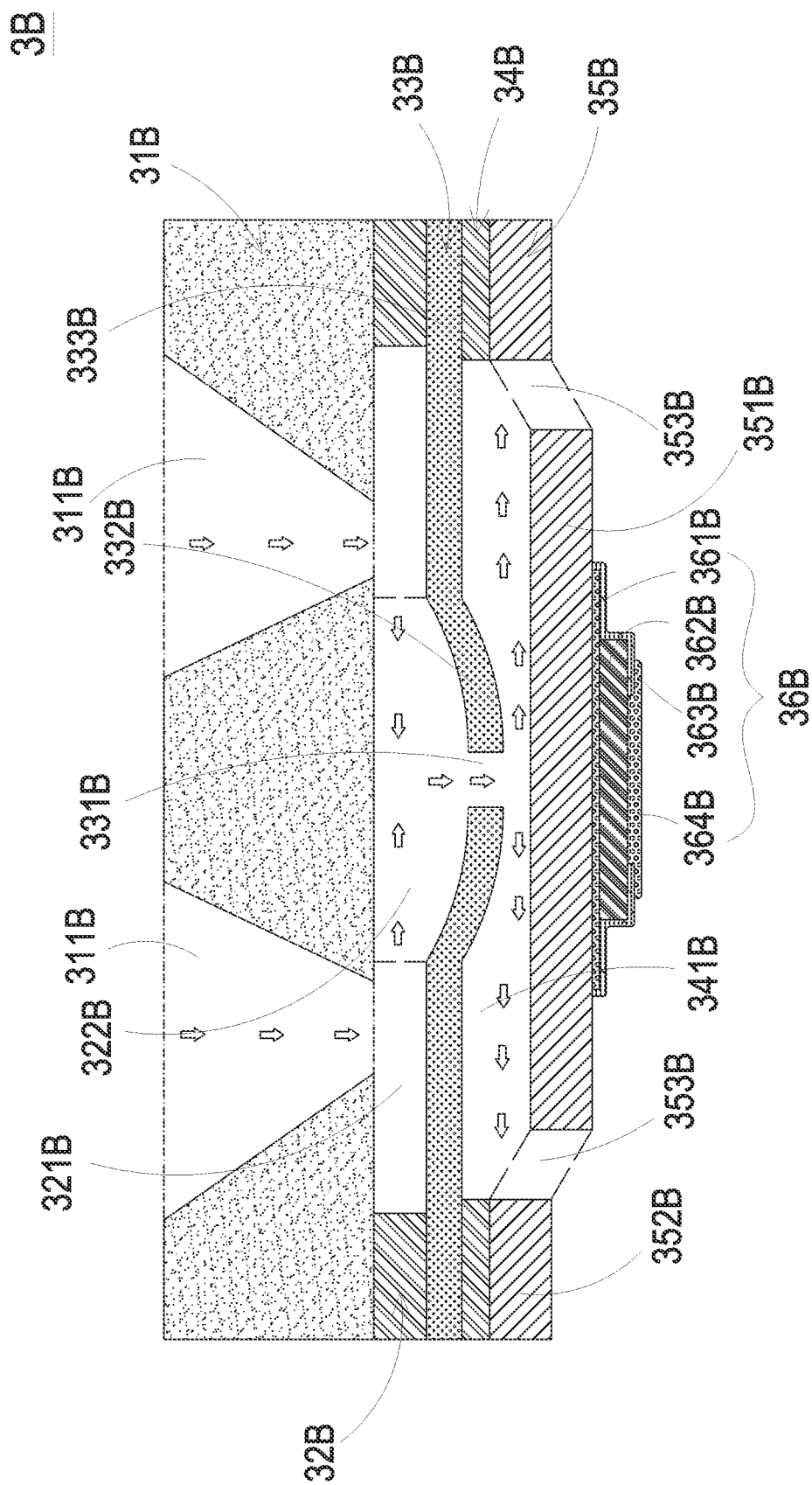
FIG. 3B and FIG. 3C illustrate schematic cross-sectional views showing the operation steps of the MEMS pump shown in FIG. 3A.
Figure 3C:
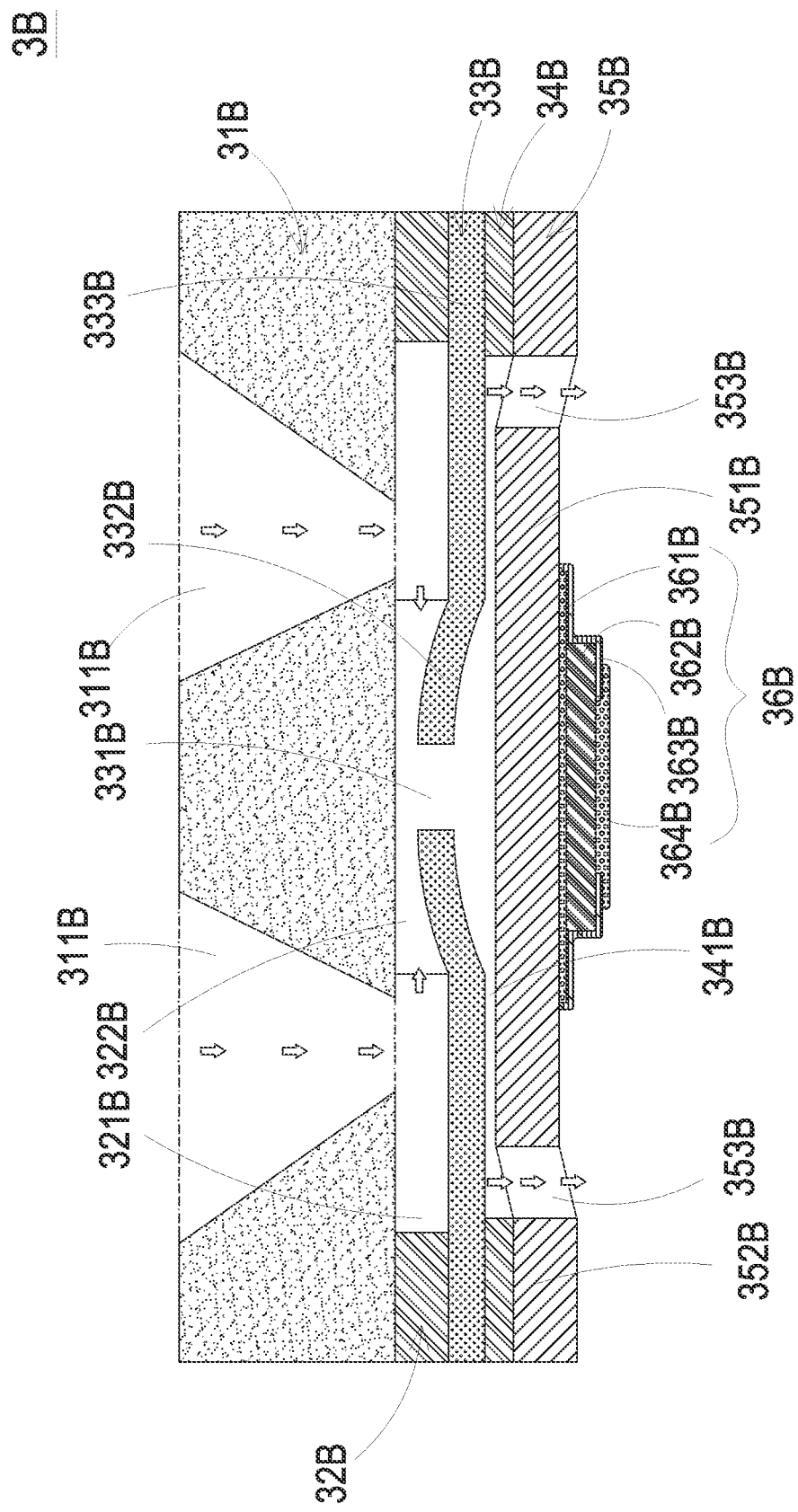

Furthermore, as shown in FIG. 3A to FIG. 3C, in some embodiments, the flow-guiding unit 3 may be an MEMS pump 3B including an inlet base 31B, a third oxide layer 32B, a resonance layer 33B, a fourth oxide layer 34B, a vibration layer 35B, and a second piezoelectric component 36B, which are all fabricated by semiconductor manufacturing processes. The semiconductor manufacturing processes include an etching process and a deposition process. The etching process may be a wet etching process, a dry etching process, or a combination thereof, but not limited thereto. The deposition process may be a physical vapor deposition (PVD) process, a chemical vapor deposition (CVD) process, or a combination thereof, but not limited thereto. The detailed descriptions about the process are omitted.

In some embodiments, the aforementioned inlet base 31B is formed with at least one inlet hole 311B by a silicon substrate etching process. The third oxide layer 32B is formed and stacked on the inlet base 31B by deposition, and the third oxide layer 32B is formed with a plurality of convergence channels 321B and a convergence room 322B by etching. The convergence channels 321B are in communication between the at least one inlet hole 311B of the inlet base 31B and the convergence room 322B. The resonance layer 33B formed and stacked on the third oxide layer 32B through a silicon substrate deposition process is formed with a through hole 331B, a vibration area 332B, and a fixed area 333B by etching. The through hole 331B is formed at a center portion of the resonance layer 33B. The vibration area 332B is formed on a periphery of the through hole 331B. The fixed area 333B is formed on a periphery of the resonance layer 33B. The fourth oxide layer 34B is formed and stacked on the resonance layer 33B by deposition, and the fourth oxide layer 34B is formed with a compression chamber area 341 by partially etching. The vibration layer 35B formed and stacked on the fourth oxide layer 34B by a silicon substrate deposition process is formed with an actuation area 351B, an outer peripheral area 352B, and a plurality of ventilation holes 353B by etching. The actuation area 351B is formed at a center portion of the vibration layer 35B. The outer peripheral area 352B is formed around a periphery of the actuation area 351B. The ventilation holes 353B are respectively formed between the actuation area 351B and the outer peripheral area 352B. Accordingly, a compression chamber is formed by the vibration layer 35B and the compression chamber area 341B of the fourth oxide layer 34B. The second piezoelectric component 36B formed and stacked on the actuation area 351B of the vibration layer 35B by deposition includes a second lower electrode layer 361B, a second piezoelectric layer 362B, a second insulation layer 363B, and a second upper electrode layer 364B. The second lower electrode layer 361B is formed and stacked on the actuation area 351B of the vibration layer 35B by deposition, and the second piezoelectric layer 362B is formed and stacked on a portion of a surface of the second lower electrode layer 361B by deposition. The second insulation layer 363B is formed and stacked on a portion of a surface of the second piezoelectric layer 362B by deposition. The second upper electrode layer 364B is formed and stacked on the surface of the second insulation layer 363B and the remaining portion of the surface of the second piezoelectric layer 362B which is not covered by the second insulation layer 363B for being electrically connected to the second piezoelectric layer 362B.

The structure of the MEMS pump 3B can be appreciated from above description. Next, the operation of gas introduction implemented by the MEMS pump 3B is elaborated below accompanied with FIG. 3B and FIG. 3C. The second piezoelectric component 36B drives the vibration layer 35B and the resonance layer 33B to resonate with the second piezoelectric component 36B. Thus, the gas outside the MEMS pump 3B is drawn through the at least one inlet hole 311B, passes through the convergence channels 321B, and then is converged at the convergence room 322B. Afterwards, the gas further passes through the through hole 311B of the resonance layer 33B, and then be discharged out from the ventilation holes 353B of the vibration layer 35B, thereby achieving high volume transmission of gas.

Figure 4A:
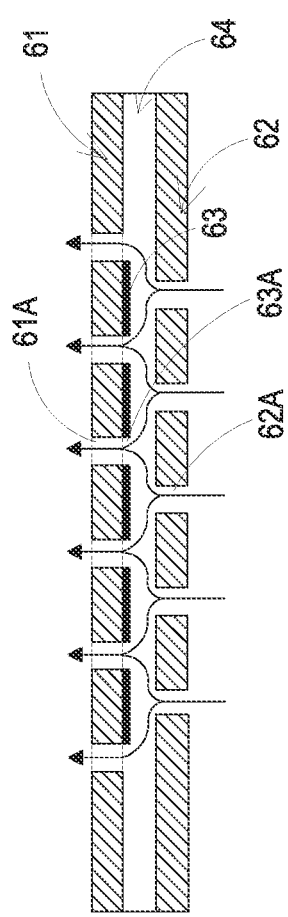
FIG. 4A to FIG. 4D illustrate schematic views of a valve unit according to an exemplary embodiment of the present disclosure.
Figure 4B:
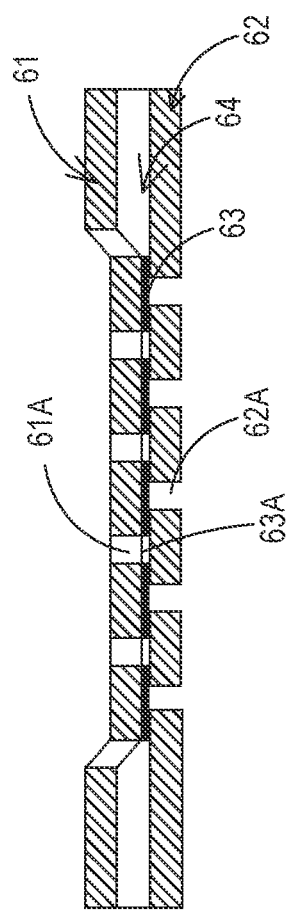

Please refer to FIG. 4A and FIG. 4B. In some embodiments, the inlet valves 15L, 25L, 35L and the outlet valves 14L, 24L, 34L may be valve units 6 including a valve conductive layer 61, a valve substrate layer 62, and a flexible membrane 63, respectively. The valve unit 6 may be, but not limited thereto, made of graphene material so as to have a miniaturized structure. The valve conductive layer 61 is made of a charged piezoelectric material, electrically connecting to a microprocessor to control the microprocessor to deform. An accommodating space 64 is maintained between the valve conductive layer 61 and the valve substrate layer 62. When the valve conductive layer 61 does not receive the driving signal from the microprocessor, the valve conductive layer 61 is retained in the accommodating space 64 and spaced apart from the valve substrate layer 62. The flexible membrane 63 made of a flexible material is attached on a side of the valve conductive layer 61 and placed in the accommodating space 64. A plurality of holes 61A, 62A, 63A is respectively formed on the valve conductive layer 61, the valve substrate layer 62, and the flexible membrane 63. The holes 61A of the valve conductive layer 61 and the holes 63A of the flexible membrane 63 are aligned with each other, and the holes 62A of the valve substrate layer 62 and the holes 61A of the valve conductive layer 61 are not aligned with each other. Therefore, as shown in FIG. 4A, when the valve conductive layer 61 does not deform, the valve conductive layer 61 is retained in the accommodating space 64 and spaced apart from the valve substrate layer 62, thereby allowing the valve unit 6 to be in an opened state although the holes 62A of the valve substrate layer 62 and the holes 61A of the valve conductive layer 61 are not aligned with each other. As a result, since the holes 61A of the valve conductive layer 61 and the holes 63A of the flexible membrane 63 are aligned with each other, the gas enters into the accommodating space 64 from the holes 62A of the valve substrate layer 62, and flows through the holes 63A of the flexible membrane 63 and the holes 61A of the valve conductive layer 61.

As shown in FIG. 4B, when the valve conductive layer 61 deforms, the valve conductive layer 61 is moved close to and attach to the valve substrate layer 62, so that the flexible membrane 63 covers the holes 62A of the valve substrate layer 62 since the holes 63A of the flexible membrane 63 and the holes 62A of the valve substrate layer 62 are not aligned with each other, thereby allowing the valve unit 6 to be in a closed state and not allow the gas to pass therethrough.

Figure 4C:
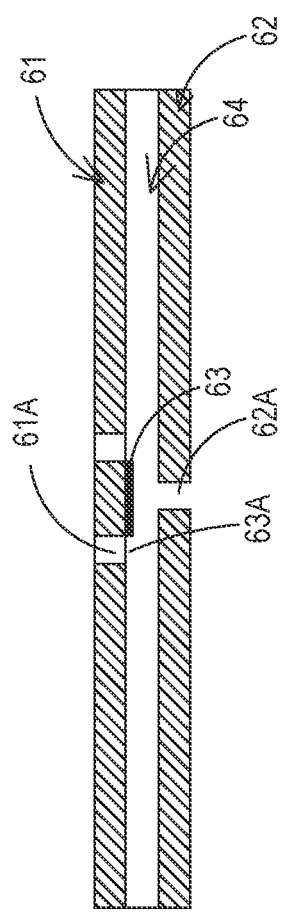
Figure 4D:
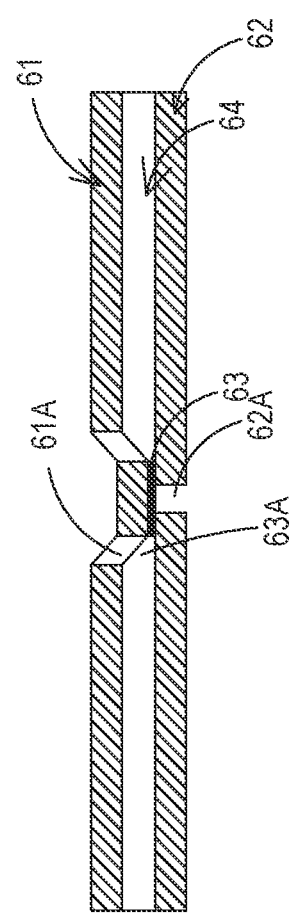

Please refer to FIG. 4C and FIG. 4D, another embodiment of the valve unit 6 is illustrated. The difference between the valve unit 6 in the above-mentioned embodiment and this embodiment resides in the number of the holes. In this embodiment, both of the numbers for the holes 61A, 63A of the valve conductive layer 61 and the flexible membrane are two, and the number for the hole 62A of the valve substrate layer 62 is one. The material and the operation steps in these embodiments are the same and not reiterated.

Figure 5:
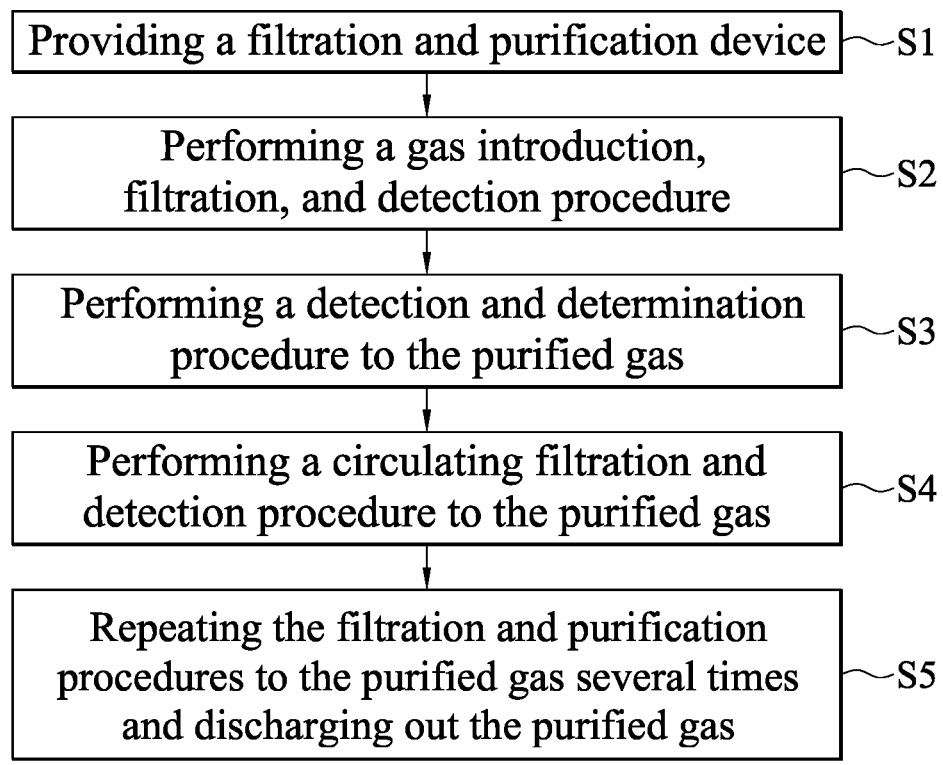
FIG. 5 illustrates a flowchart of a filtration and purification processing method according to an exemplary embodiment of the present disclosure.

Please refer to FIG. 5, a filtration and purification processing method is provided, and the method includes following steps: (1) providing a filtration and purification device; (2) performing a gas introduction, filtration, and detection procedure; (3) performing a detection and determination procedure to the purified gas; (4) performing a circulating filtration and detection procedure to the purified gas; and (5) repeating the filtration and purification procedures to the purified gas several times and discharge out the purified gas.

Figure 6:
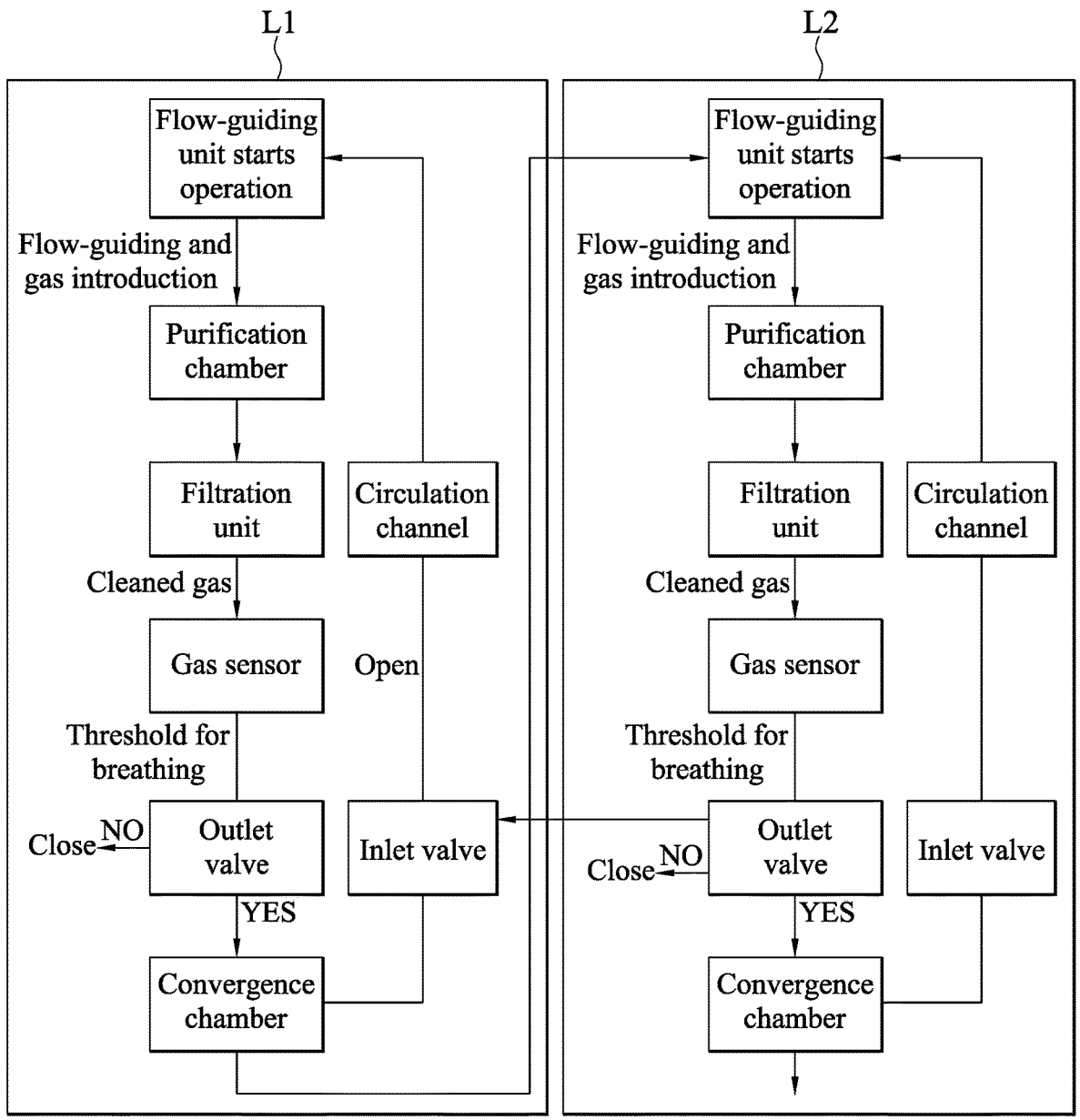
FIG. 6 illustrates a schematic view showing the filtration and purification processing method according to the exemplary embodiment of the present disclosure.

Please refer to FIG. 1, FIG. 5, and FIG. 6. In the step S1, the filtration and purification device 10 includes a first filtration passage layer L1, a second filtration passage layer L2, a last filtration passage layer L3, convergence chambers 12L, 22L, 32L, and circulation channels 13L, 23L, 33L. The first filtration passage layer L1, the second filtration passage layer L2, and the last filtration passage layer L3 are stacked with each other. The first filtration passage layer L1, the second filtration passage layer L2 and the last filtration passage layer L3 include a plurality of purification chambers 11L, 12L, 31L arranged in parallel, respectively; the bottoms of the purification chambers 11L,12L, 31L are in communication with a convergence chambers 12L, 22L, 32L, respectively; and circulation channels 13L, 23L, 33L are disposed at one side of the first filtration passage layer L1, the second filtration passage layer L2, and the last filtration passage layer L3 and in communication with the convergence chambers 12L, 22L, 32L, respectively. Each of the purification chambers 11L, 21L, 31L includes at least one flow-guiding unit 3, at least one filtration unit 4, at least one gas sensor 5, and an outlet valve 14L, 24L, 34L. The circulation channel 13L, 23L, 33L has an inlet valve 15L, 25L, 35L. The inlet valves 15L, 25L, 35L are disposed between the convergence chambers 12L, 22L, 32L and the circulation channels 13L, 23L, 33L, respectively. The outlet valves 14L, 24L, 34L are disposed between the purification chamber 11L, 21L, 31L and the convergence chambers 12L, 22L, 32L, respectively, and control the communication between the purification chambers 11L, 21L, 31L and the convergence chambers 12L, 22L, 32L, respectively, and the inlet valves 15L, 25L, 35L control the communication between the convergence chambers 12L, 22L, 32L and the circulation channels 13L, 23L, 33L, respectively.

In the step S2, in the first filtration passage layer L1, the second filtration passage layer L2, and the third filtration passage layer L3, the outlet valve 14L, 24L, 34L of each of the purification chambers 11L, 21L, 31L is opened, and the flow-guiding units 3 are driven to introduce the gas outside the filtration and purification device 10 into each of the purification chambers 11L, 21L, 31L. Then, the filtration units 4 filter the introduced gas to obtain a purified gas, and the purified gas is introduced to each of the convergence chambers 12L, 22L, 32L.

In the step S3, in the first filtration passage layer L1, the second filtration passage layer L2, and the third filtration passage layer L3, the gas sensor 5 in each of the purification chambers 11L, 21L, 31L detects the gas quality of the purified gas to determine if the gas quality of the purified gas reach a threshold for breathing.

In the step S4, in the first filtration passage layer L1, the second filtration passage layer L2, and the third filtration passage layer L3, when the purified gas does not reach the threshold for breathing, the purified gas is circulating, filtering and detecting again. In each of the filtration passage layers L1, L2, L3, the outlet valve 14L, 24L, 34L of the purification chamber 11L, 21L, 31L, where the gas sensor 5 is located, is controlled to be closed, the outlet valves 14L, 24L, 34L of the purification chambers 11L, 21L, 31L of a next filtration passage layer are closed, and the inlet valve 15L, 25L, 35L of the circulation channel 14L, 24L, 34L of a previous filtration passage layer is opened, so that the purified gas of the previous filtration passage layer can be introduced back to the previous filtration passage layer for circulating filtering, purifying, and detecting again.

In the step S5, the purified gas in the convergence chamber 12L, 22L of the previous filtration passage layer enters into the filtration units 4 of the purification chambers 22L, 32L of the next filtration passage layer to be filtered and purified for second-time, and the outlet valves 14L, 24L of the next filtration passage layer are opened when the purified gas of the next filtration passage layer reaches the threshold for breathing, and the purified gas of the next filtration passage layer is introduced into the last filtration passage layer to complete multiple filtration and purification, so as to be discharged out for breathing.

Based on the above disclosure, in the filtration and purification device of one or some embodiments of the present disclosure, the flow-guiding unit introduces the gas into the filtration and purification device, so that the filtration unit in the device filters the gas, and then the gas sensor detects the quality of the purified gas. When the gas quality of the purified gas does not reach the threshold for breathing, the purified gas is filtered, purified, and detected repeatedly until the gas quality of the purified gas reaches the threshold for breathing, and then the purified gas is discharged out. Moreover, the filtration and purification device according to one or some embodiments of the present invention can be inserted into the nostrils of the user, so that the purified gas that reaches the threshold for breathing can be directly introduced into the main body.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A filtration and purification device, comprising:
a main body having an inlet end and an outlet end; and
at least one filtration passage layer disposed in the main body, wherein the at least one filtration passage layer comprises a plurality of purification chambers, a convergence chamber, and a circulation channel, wherein the purification chambers are arranged in parallel and bottoms of the purification chambers are in communication with the convergence chamber, and the circulation channel is in communication with the convergence chamber, wherein each of the purification chambers comprise at least one flow-guiding unit, at least one filtration unit, at least one gas sensor, and an outlet valve, wherein the circulation channel has an inlet valve disposed between the convergence chamber and the circulation channel, and each of the outlet valves is disposed between the corresponding purification chamber and the convergence chamber, and wherein each of the outlet valves controls the communication between the corresponding purification chamber and the convergence chamber, and the inlet valve control the communication between the convergence chamber and the circulation channel;

wherein when the at least one flow-guiding unit is driven, a gas is introduced into each of the purification chambers from the inlet end of the main body, and the at least one filtration unit filters the gas and obtain a purified gas, wherein when the purified gas is introduced into the convergence chamber, the at least one gas sensor detects a gas quality of the purified gas to determine if a gas quality of the purified gas reaches a threshold for breathing, wherein when the purified gas does not reach the threshold for breathing, the inlet valve of the circulation channel is opened, so that the purified gas is capable of being introduced back to the at least one filtration passage layer, and wherein when the purified gas reaches the threshold for breathing, the purified gas is discharged out of the filtration and purification device from the outlet end.

2. The filtration and purification device according to claim 1, wherein the at least one filtration passage layer comprises a first filtration passage layer and a second filtration passage layer, wherein the first filtration passage layer and the second filtration passage layer are formed and stacked with each other by semiconductor manufacturing processes, and in each of the purification chambers of the first filtration passage layer and the second filtration passage layer, the at least one flow-guiding unit is disposed adjacent to the inlet end, the at least one filtration unit and the at least one gas sensor are sequentially disposed below the at least one flow-guiding unit, and the outlet valve is disposed below the at least one gas sensor adjacent to the outlet end, wherein the at least one flow-guiding unit guides the gas into the purification chamber, and the gas is filtered by the at least one filtration unit to obtain the purified gas, and then the purified gas passes through the at least one gas sensor to detect the gas quality of the purified gas to determine if the gas quality of the purified gas reaches the threshold for breathing, and the purified gas is discharged out of the purification chamber and introduced into the convergence chamber from the outlet valve of the corresponding filtration passage layer.

3. The filtration and purification device according to claim 2, wherein when the gas sensors of the purification chambers of the first filtration passage layer detects that the purified gas does not reach the threshold for breathing, the outlet valves of the purification chambers are closed, so that the purified gas which does not reach the threshold for breathing is not introduced in the convergence chamber of the first filtration passage layer.

4. The filtration and purification device according to claim 2, wherein when the gas sensors of the purification chambers of the first filtration passage layer detects that the purified gas does not reach the threshold for breathing, in the first filtration passage layer, the outlet valve of the purification chamber where the at least one gas sensor is located is controlled to be closed and not in communication with the convergence chamber, so that the purified gas which does not reach the threshold for breathing is not introduced into the convergence chamber of the first filtration passage layer, wherein the outlet valves of the purification chambers of the second filtration passage layer are closed, and the inlet valve of the circulation channel of the first filtration passage layer is opened, so that the purified gas of the first filtration passage layer is capable of being introduced back to the first filtration passage layer for circulating, filtering, purifying, and detecting, wherein the purified gas in the convergence chamber of the first filtration passage layer is capable of entering into the filtration units of the purification chambers of the second filtration passage layer to be filtered and purified for the second-time, and the gas sensors of the purification chambers of the second filtration passage layer detect whether the purified gas which is filtered and purified for the second-time reaches the threshold for breathing.

5. The filtration and purification device according to claim 2, further comprising a last filtration passage layer, wherein the last filtration passage layer is stacked on the second filtration passage layer and is in communication with a bottom of the second filtration passage layer, wherein when the gas sensors of the purification chambers of the second filtration passage layer detect that the purified gas does not reach the threshold for breathing, in the second filtration passage layer, the outlet valve of the purification chamber where the at least one gas sensor is located is controlled to be closed and not in communication with the convergence chamber, so that the purified gas which does not reach the threshold for breathing is not introduced into the convergence chamber of the second filtration passage layer.

6. The filtration and purification device according to claim 5, wherein when the gas sensors of the purification chambers of the last filtration passage layer detect that the purified gas does not reach the threshold for breathing, the outlet valves of the purification chambers of the last filtration passage layer are closed, and the inlet valve of the circulation channel of the second filtration passage layer is opened, so that the purified gas of the second filtration passage layer is capable of being introduced backed to the second filtration passage layer for circulating, filtering, purifying, and detecting again, and the purified gas in the convergence chamber of the second filtration passage layer is capable of entering into the filtration units of the purification chambers of the last filtration passage layer to be filtered and purified for the second-time, and the gas sensors of the purification chambers of the last filtration passage layer detect that if the purified gas which is filtered and purified for the second-time reaches the threshold for breathing and determine if the purified gas is discharged out of the filtration and purification device from the outlet end, so as to provide the purified gas.

7. The filtration and purification device according to claim 1, wherein the main body is made of a soft, flexible, and antiallergic material.

8. The filtration and purification device according to claim 1 further comprising a driving chip and a battery respectively packaged on the at least one filtration passage layer by semiconductor manufacturing processes, wherein the battery provides operation power for the driving chip, so as to drive the at least one flow-guiding unit, the at least one gas sensor, the inlet valve, and the outlet valves of each of the filtration passage layers.

9. The filtration and purification device according to claim 8, wherein the driving chip further comprises a microprocessor and a communication device, wherein the microprocessor is capable of controlling the at least one flow-guiding unit, the at least one gas sensor, the inlet valve, and the outlet valves of each of the filtration passage layers, receiving a gas quality data of the gas detected by the at least one gas sensor for calculating and processing, and transmitting the gas quality data to an external device through the communication device, and the external device is capable of receiving the gas quality data and issuing a warning notice and displaying a record of the gas quality data.

10. The filtration and purification device according to claim 1, wherein the at least one flow-guiding unit is a microelectromechanical systems (MEMS) pump, wherein the MEMS pump comprises:
- an inlet base formed with at least one inlet hole by a silicon substrate etching process;
- a third oxide layer formed and stacked on the inlet base by deposition, wherein the third oxide layer is formed with a plurality of convergence channels and a convergence room by etching, and wherein the convergence channels are in communication between the at least one inlet holes of the inlet base and the convergence room;
- a resonance layer formed and stacked on the third oxide layer through a silicon substrate deposition process having a through hole, a vibration area, and a fixed area formed by etching, wherein the through hole is formed at a center portion of the resonance layer, the vibration area is formed on a periphery of the through hole, and the fixed area is formed on a periphery of the resonance layer;
- a fourth oxide layer formed and stacked on the resonance layer by deposition, wherein the fourth oxide layer is formed with a compression chamber area by etching;
- a vibration layer formed and stacked on the fourth oxide layer by a silicon substrate deposition process having an actuation area, an outer peripheral area, and a plurality of ventilation holes formed by etching, wherein the actuation area is formed at a center portion of the vibration layer, the outer peripheral area is formed around a periphery of the actuation area, the ventilation holes are respectively formed between the actuation area and the outer peripheral area, and a compression chamber is defined between the vibration layer and the compression chamber area of the fourth oxide layer; and
- a second piezoelectric component formed and stacked on the actuation area of the vibration layer by deposition having a second lower electrode layer, a second piezoelectric layer, a second insulation layer, and a second upper electrode layer, wherein the second lower electrode layer is formed and stacked on the actuation area of the vibration layer by deposition, the second piezoelectric layer is formed and stacked on a portion of a surface of the second lower electrode layer by deposition, the second insulation layer is formed and stacked on a portion of a surface of the second piezoelectric layer by deposition, and wherein the second upper electrode layer is formed and stacked on the surface of the second insulation layer and the remaining portion of the surface of the second piezoelectric layer which is not covered by the second insulation layer for being electrically connected to the second piezoelectric layer; and
- wherein the second piezoelectric component is capable of driving the vibration layer and the resonance layer to resonate with the second piezoelectric component, the gas outside the second actuator is then drawn into the second actuator through the at least one inlet hole, passes through the convergence channels, and then converges at the convergence room; and the gas further passes through the through hole of the resonance layer, and then is discharged out from the plurality of ventilation holes of the vibration layer, thereby achieving transmission of the gas.

11. The filtration and purification device according to claim 1, wherein the at least one gas sensor is a particulate sensor capable of detecting particulate matters of PM1, PM2, or PM10.

12. The filtration and purification device according to claim 1, wherein the at least one filtration unit is a high-efficiency particulate air (HEPA) filter.

13. The filtration and purification device according to claim 1, wherein the at least one filtration unit is coated with a cleansing element containing chlorine dioxide for suppressing viruses and bacteria in the gas.

14. The filtration and purification device according to claim 1, wherein both the inlet valve and the outlet valve are valve units, the valve unit comprises a valve conductive layer, a valve substrate layer, and a flexible membrane, wherein the valve conductive layer is made of a charged piezoelectric material, electrically connecting to a microprocessor to be controlled by the microprocessor to deform, wherein an accommodating space is maintained between the valve conductive layer and the valve substrate layer, wherein the flexible membrane is made of a flexible material and attached on a side of the valve conductive layer so as to be placed in the accommodating space, wherein a plurality of holes are respectively formed on the valve conductive layer, the valve substrate layer, and the flexible membrane, the holes of the valve conductive layer and the holes of the flexible membrane are aligned with each other, and the holes of the valve substrate layer and the holes of the valve conductive layer are not aligned with each other, wherein when the valve conductive layer is not controlled by the microprocessor, the valve conductive layer is retained in the accommodating space and spaces apart from the valve substrate layer, thereby allowing the valve unit to be in an opened state since the holes of the valve substrate layer and the holes of the valve conductive layer are aligned with each other, wherein when the valve conductive layer is controlled by the microprocessor to deform, the valve conductive layer is moved close to and attach to the valve substrate layer, so that the flexible membrane covers the holes of the valve substrate layer, thereby allowing the valve unit to be in a closed state since the holes of the flexible membrane and the holes of the valve substrate layer are aligned with each other.

15. The filtration and purification device according to claim 1, further comprising a waterproof gas-permeable membrane attached to the outlet end of the main body.

* * * * *